US008615881B2

(12) United States Patent
Knierim

(10) Patent No.: US 8,615,881 B2
(45) Date of Patent: Dec. 31, 2013

(54) OLEOPHOBIC INK JET ORIFICE PLATE

(75) Inventor: David L. Knierim, Wilsonville, OR (US)

(73) Assignee: Xerox Corporation, Norwalk, CT (US)

( * ) Notice: Subject to any disclaimer, the term of this patent is extended or adjusted under 35 U.S.C. 154(b) by 76 days.

(21) Appl. No.: 13/467,393

(22) Filed: May 9, 2012

(65) Prior Publication Data

US 2013/0298402 A1    Nov. 14, 2013

(51) Int. Cl.
    *B21D 53/76*      (2006.01)
    *B23P 17/00*      (2006.01)
    *B41J 2/015*      (2006.01)

(52) U.S. Cl.
    USPC ............................................ 29/890.1; 347/20

(58) Field of Classification Search
    USPC ................... 29/890.1; 347/20, 40; 430/270.1
    See application file for complete search history.

(56) References Cited

U.S. PATENT DOCUMENTS

| | | | | |
|---|---|---|---|---|
| 4,719,480 A | * | 1/1988 | Elrod et al. | 347/46 |
| 5,121,141 A | * | 6/1992 | Hadimoglu et al. | 347/46 |
| 5,867,189 A | * | 2/1999 | Whitlow et al. | 347/47 |
| 7,279,587 B2 | * | 10/2007 | Odell et al. | 554/37 |
| 8,506,051 B2 | * | 8/2013 | Gulvin et al. | 347/47 |
| 2002/0005878 A1 | * | 1/2002 | Moon et al. | 347/58 |
| 2011/0157278 A1 | * | 6/2011 | Gulvin et al. | 347/45 |

OTHER PUBLICATIONS

Dykes et al., "Creation of Embedded Structures in SU-8", Proc. of SPIE vol. 6465, 64650N, 2007, 12 pages.*
Micro Chem, NANO SU-8, Negative Tone Photoresist Formulations 50-100, 4 pages.*
Micro Chem, NANO™ SU-8, Negative Tone Photoresist Formulations 50-100, 4 pages.

* cited by examiner

*Primary Examiner* — David Angwin
(74) *Attorney, Agent, or Firm* — MH2 Technology Law Group LLP

(57) ABSTRACT

A method for forming a print head having a plurality of reentrant structures to reduce wetting of the print head surface by the ink during use, and a resulting structure. The method can include the use of a single photosensitive layer to form plurality of reentrant structures, each having a pillar and a cap which overhangs the pillar. A plurality of print head nozzles can also be formed during the formation of the reentrant structures. Embodiments can include the formation of pillars, caps, and nozzles using three different masks, two different masks, or a single mask.

17 Claims, 4 Drawing Sheets

OLEOPHOBIC INK JET ORIFICE PLATE

FIELD OF THE EMBODIMENTS

The present teachings relate to the field of ink jet printing devices and, more particularly, to methods of making ink jet print heads and orifice plates (i.e., aperture plates) for ink jet print heads and other fluid-ejecting devices.

BACKGROUND OF THE EMBODIMENTS

Fluid ink jet systems typically include one or more print heads having a plurality of ink jets from which drops of fluid are ejected toward a print medium. The ink jets of a print head receive ink from an ink supply chamber (manifold) in the print head which, in turn, receives ink from a source such as an ink reservoir or an ink cartridge. Each ink jet includes a channel having one end in fluid communication with the ink supply manifold. The other end of the ink channel has an orifice or nozzle for ejecting drops of ink. The nozzles of the ink jets may be formed in an aperture plate that has openings corresponding to the nozzles of the ink jets. During operation, drop ejecting signals activate actuators to expel drops of fluid from the ink jet nozzles onto the print medium. By selectively activating the actuators to eject ink drops as the print medium and print head assembly are moved relative to one another, the deposited drops can be precisely patterned to form particular text and/or graphic images on the print medium.

Conventional ink jet print heads such as solid ink jet (SIJ) print heads can be constructed using stainless steel aperture plates with nozzles which are etched chemically or formed mechanically. The stainless steel aperture plate can be coated, for example with polytetrafluoroethylene (PTFE), to reduce wetting of the aperture plate by the ink. Decreased wetting assists in proper jetting of ink away from the print head by reducing adhesion of the ink to the print head as it is being ejected from the nozzle, and can result in a self-cleaning print head and improved print quality.

Conventional stainless steel aperture plates for ink jet print heads are expensive to manufacture, for example due to the required formation of apertures or nozzles within the stainless steel substrate using chemical or mechanical etch techniques. A polymer aperture plate which uses, for example, a polyimide substrate can be less expensive to manufacture, for example because the nozzles can be laser etched to reduce processing time and costs. Either a stainless steel aperture plate or a polymer aperture plate can be coated with an oleophobic coating, which is an anti-wetting material such as PTFE which can result in improved print quality.

Another feature which can be formed over the aperture plate to reduce wetting is referred to as a reentrant structure or an overhang structure. A particular method of forming a plurality of reentrant structures is described in U.S. patent application Ser. No. 12/648,004, filed Dec. 28, 2009, commonly assigned herewith and incorporated herein by reference in its entirety. Reentrant structures can include a plurality of protrusions over the front (external) surface of the aperture plate. Each protrusion can include a pillar or stem formed from a first layer which is topped by a cap which overhangs the pillar and is formed from a second layer. The reentrant structures can be formed on the substrate itself, or on an oleophobic layer which coats the substrate. The aperture plate can thus include the substrate, the oleophobic layer, and the plurality reentrant structures.

A method of forming a print head having improved performance and lower cost than conventional print heads would be desirable.

SUMMARY OF THE EMBODIMENTS

The following presents a simplified summary in order to provide a basic understanding of some aspects of one or more embodiments of the present teachings. This summary is not an extensive overview, nor is it intended to identify key or critical elements of the present teachings nor to delineate the scope of the disclosure. Rather, its primary purpose is merely to present one or more concepts in simplified form as a prelude to the detailed description presented later.

An embodiment according to the present teachings can include a method for forming an ink jet print head, including exposing a photosensitive layer to a first patterned light source to define a plurality of reentrant structure pillars, wherein unexposed portions of the photosensitive layer remain unexposed to the first light source during definition of the plurality of reentrant structure pillars, exposing the photosensitive layer to a second patterned light source to define a plurality of reentrant structure caps for the plurality of reentrant structures, wherein unexposed portions of the photosensitive layer remain unexposed to the second light source during definition of the plurality of reentrant structure caps and, after exposing the photosensitive layer to define the plurality of reentrant structure pillars and the plurality of reentrant structure caps, removing the unexposed portions of the photosensitive layer to form the plurality of reentrant structures.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures.

Figure 1:
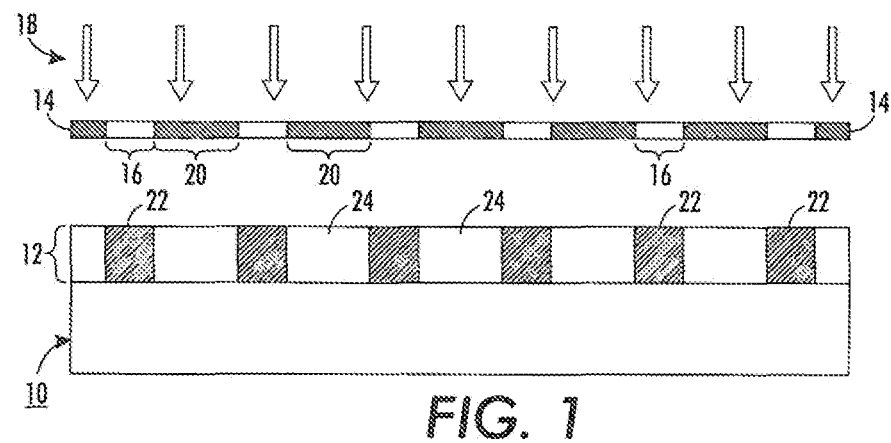
FIGS. 1-4 are magnified cross sections of a portion of an aperture plate assembly and depict intermediate in-process structures formed during an embodiment of the present teachings.

It should be noted that some details of the FIGS. have been simplified and are drawn to facilitate understanding of the present teachings rather than to maintain strict structural accuracy, detail, and scale.

DESCRIPTION OF THE EMBODIMENTS

Reference will now be made in detail to the present exemplary embodiments of the present teachings, examples of which are illustrated in the accompanying drawings. Wherever possible, the same reference numbers will be used throughout the drawings to refer to the same or like parts.

As used herein, the word "printer" encompasses any apparatus that performs a print outputting function for any purpose, such as a digital copier, bookmaking machine, facsimile machine, a multi-function machine, etc. The word "polymer" encompasses any one of a broad range of carbon-based compounds formed from long-chain molecules including thermoset polyimides, thermoplastics, resins, polycarbonates, and related compounds known to the art.

The formation of a reentrant, mushroom-shaped structure over a front surface of an aperture plate substrate can include the use of a plurality of masks and a plurality of masking stages. In an embodiment of the present teachings, a plurality of reentrant structures can be formed from a single layer using two masks and two masking stages. In another embodiment of the present teachings, the reentrant structures can be formed from a single layer using one mask and one masking stage. In addition, the mask(s) which form(s) the reentrant structures can be used to also form the nozzle itself, if the aperture plate is a material which can be laser ablated. Thus an embodiment of the present teachings can reduce the number of layers and the number of masks required to form a plurality of reentrant structures and nozzles, and therefore reduce manufacturing complexity, materials costs, and manufacturing costs.

An embodiment of the present teachings is described in FIGS. 1-7. While the FIGS. depict a portion of a magnified aperture plate substrate 10 which will include a single nozzle, it will be understood that a completed aperture plate can include hundreds or thousands of nozzles. In an embodiment, the aperture plate substrate 10 can be a polymer substrate such as a polyimide layer that can be ablated using a laser during subsequent processing. A photosensitive layer (i.e., photoresist or resist) 12 can be formed over the aperture plate substrate 10 using, for example, a spin coating process or another suitable process, and then soft baked according to known techniques. The resist 12 can be a negative photoresist such as SU-8 available from MicroChem of Newton, Mass. The resist 12 can be formed to a thickness of between about 2 µm and about 15 µm, for example between about 5 µm and about 7 µm.

Next, a first patterning process is performed using, for example, optical photolithography and a first patterned mask (i.e., a pillar mask) 14. The pillar mask 14 can include transparent first regions 16 which allow the passage of a first light source 18 through the mask, and opaque second regions 20 which block the passage of the first light source 18. The opaque second regions 20 can be formed by patterning chrome regions on a glass or quartz substrate in accordance with known mask or reticle formation techniques. The pillar mask 14 is aligned with the aperture plate substrate 10 and the first patterning process is completed to expose first portions 22 of the resist 12 to the first light source 18 while second portions 24 remain unexposed. Exposure of the first portions 22 of the photosensitive layer 12 defines pillars 22 of the reentrant structures in the completed device.

The first light source 18 can be of a sufficient wavelength to develop the entire thickness of the exposed portions 22 of the resist 12, from a top surface to a bottom surface at the interface with the aperture plate substrate 10 as depicted in FIG. 1. The first light source 18 can have a long UV wavelength, for example between about 330 nm and about 420 nm, for example about 350 nm, with total exposure between about 100 mJ/cm$^2$ and about 200 mJ/cm$^2$. SU-8 has a higher transparency to longer wavelengths than to shorter wavelengths, and is thus exposed deeper into the resist 12 than it would be using shorter wavelength light.

Figure 2:
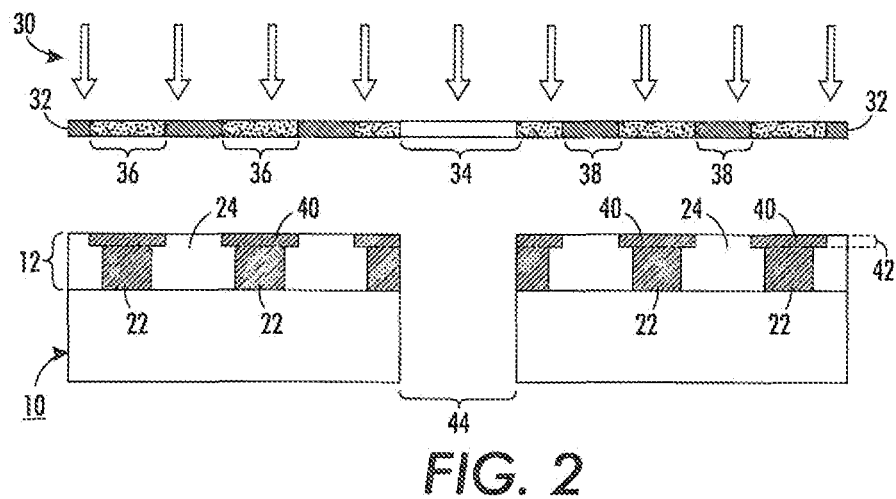

Next, prior to developing the photosensitive layer 12, the photosensitive layer 12 is exposed to a second light source 30 through a second patterned mask (i.e., cap mask) 32 as depicted in FIG. 2, wherein the second light source 30 has a different wavelength than the first light source 18. The cap mask 32 can have first regions 34, second regions 36, and third regions 38, wherein each region 34-38 has a different transparency. The first regions 34 (i.e., transparent regions) can have a high transparency (i.e., low opacity), for example between about 95% and 100% transparency, or between about 98% and 100% transparency, which allows a high percentage of the second light source 30 to pass through the second mask 32 which define the plurality of nozzles 44. The second regions 36 (i.e., gray regions or halftone regions) can have an intermediate transparency, for example between about 0.015% and about 0.2% transparency, or between about 0.02% and about 0.1% transparency, for example about 0.05% transparency. The third regions 38 (i.e., opaque regions) can have a low transparency (i.e., high opacity), for example between about 0% and about 0.01% transparency, for example 0% transparency (100% opacity).

The second light source 30 can have a short wavelength, for example between about 220 nm and about 300 nm, for example about 248 nm. The second light source 30 can be output by a laser, for example an excimer laser having a pulse energy density of between about 0.5 J/cm$^2$ and about 4.0 J/cm$^2$, for example about 1.5 J/cm$^2$, with a pulse repetition count between about 100 pulses and about 400 pulses, for example about 200 pulses. Portions of the second light source 30 pass through the gray regions 36 with a sufficiently low intensity to expose only an upper portion 40 of the photosensitive layer 12. Exposing the upper portions 40 of the photosensitive layer 12 to the second light source 30 defines caps 40 of the reentrant structures. The intensity of the second light source 30 which passes through the gray regions 36 is determined and selected at least in part by the transparency of the gray regions 36 and the wavelength of the second light source 30, which will also determine the penetration depth 42 of the second light source 30 into the photosensitive layer 12. The penetration depth 42 can be between about 10% and about 40% of the thickness of the photosensitive layer 12, for example between about 20% and about 30% of the thickness of the photosensitive layer 12.

Additionally, portions of the second light source 30 pass through the transparent regions 34 with a sufficiently high intensity to ablate the portions of the photosensitive layer 12 and the aperture plate substrate 10 which are exposed by the transparent regions 34. An opening 44 is thereby formed through the photosensitive layer 12 and the aperture plate substrate 10, and results in the formation of a plurality of nozzle apertures 44. During use of the print head for printing, ink will be ejected through the nozzles 44, for example in response to a digital signal to a piezoelectric transducer in accordance with known techniques.

Subsequently, any additional processing is performed such as a post-exposure bake of the photosensitive layer 12. The photosensitive layer 12 is then exposed to a developer to remove the unexposed portions 24 of the photosensitive layer 12 and to leave the exposed portions 22, 40 of the photosensitive layer 12, thereby resulting in a structure similar to that depicted in FIG. 3. The FIG. 3 thus includes an aperture plate substrate 10, for example polyimide, and reentrant structures including pillars 22 and caps 40 which can be formed from a single photosensitive layer 12 such as a negative photoresist, for example SU-8. Any conventional processing of the photosensitive layer 12 can be performed, such as a rinse and dry, hard bake, etc.

Figure 3:
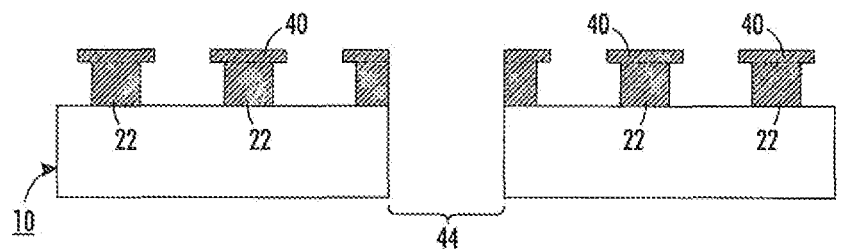
Figure 4:
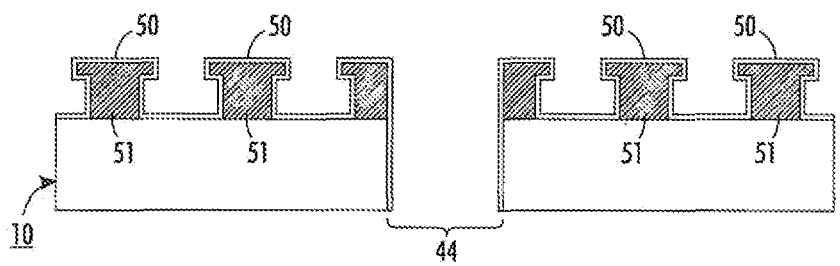

Next, the FIG. 3 structure can be coated with a conformal polymer film 50 to result in the FIG. 4 structure. The conformal polymer film 50 can be a material having a low surface energy to decrease the wetting of ink on the plurality of completed reentrant structures 51, which includes pillars 22 and caps 40, during use of the print head. In an embodiment, the FIG. 3 structure can be dip coated in a liquid polymer, or film 50 can be formed using vapor-phase application of a suitable polymer. In either case, the film 50 can have a final thickness of between about 0.1 µm and about 1.0 µm, for example about 0.3 µm.

After formation of film 50, the back side of the polyimide substrate 10 (i.e., the bottom surface of substrate 10 as depicted in FIG. 4) can be plasma cleaned to remove the polymer film 50 from the back side of aperture plate substrate 10. After completing the FIG. 4 structure, additional print head processing can be continued according to known techniques.

Figure 5:
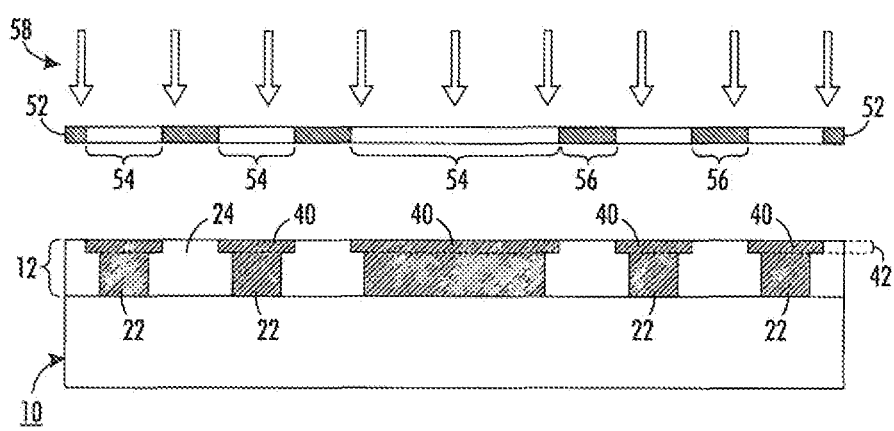
FIGS. 5 and 6 are magnified cross sections of a portion of an aperture plate assembly and depict intermediate in-process structures formed during another embodiment of the present teachings.

In another embodiment, referring to FIG. 5, reentrant structure pillars 22 can be formed with a pillar mask similar to pillar mask 14. In this embodiment, however, after defining the plurality of reentrant structure pillars 22, a cap mask 52 is used to define the reentrant structure caps 40. The cap mask 52 includes transparent regions 54 which expose the caps 40, and further includes opaque regions 56 between the transparent regions 54. The cap mask 52 does not need to include gray regions 36 of the cap mask 32 as depicted in FIG. 2. The caps 40 are exposed with a light source 58 which is of a sufficient intensity to expose only the upper part 42 of the photosensitive layer 12. In an embodiment, the light source 58 can have a wavelength of between about 220 nm and about 330 nm, for example 248 nm, and a total exposure of between about 50 mJ/cm$^2$ and about 200 mJ/cm$^2$, for example about 100 mJ/cm$^2$.

Figure 6:
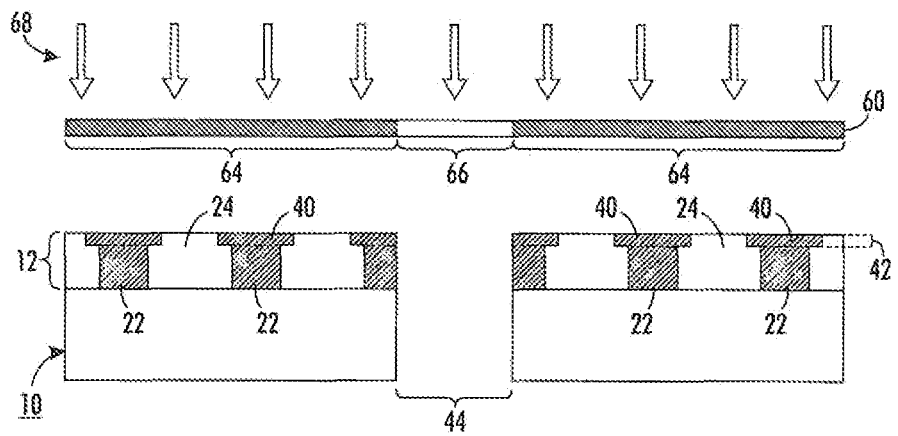

After exposing the photosensitive layer 12 using cap mask 52, a nozzle mask 60 can be used to form a plurality of nozzle apertures 44 through the photosensitive layer 12 and the aperture plate substrate 10 as depicted in FIG. 6. The nozzle mask 60 includes opaque regions 64 and transparent regions 66. A third light source 68 can be of sufficient intensity and wavelength to ablate the portions of the photosensitive layer 12 and the aperture plate substrate 10 which are exposed by the transparent regions 66 of the nozzle mask 60. The third light source 68 can be, for example, an excimer laser having a wavelength of between about 193 nm and about 330 nm, or about 248 nm, and having a pulse energy density of between about 0.5 J/cm$^2$ and about 4.0 J/cm$^2$, for example about 1.5 J/cm$^2$, with a pulse repetition count of between about 100 pulses and about 400 pulses, for example about 200 pulses. After forming the FIG. 6 structure, the unexposed portions 24 of the photosensitive layer 12 can be developed away according to known techniques, and an anti-wetting layer similar to layer 50 can be formed. This results in reentrant structures 22, 40 formed using a single photosensitive layer 12 and three masks, including a pillar mask 14, a cap mask 52, and a nozzle mask 60.

With the embodiment of FIGS. 5 and 6, a plurality of reentrant structures 22, 40 and a plurality of nozzles 44 can be formed with a single layer of resist 12, and three masks 14, 52, 60. Using three different masks can result in a process having relaxed processing constraints compared to some other embodiments of the present teachings at the cost of an additional mask.

Figure 7:
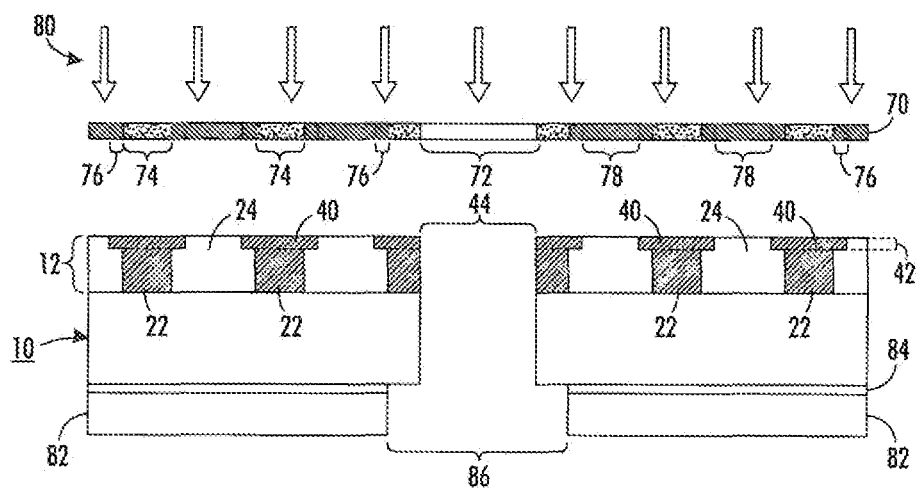
FIG. 7 is a magnified cross section of a portion of an aperture plate assembly and depicts an intermediate in-process structure formed during another embodiment of the present teachings.

Another embodiment of the present teachings is depicted in FIG. 7. This embodiment includes an aperture plate substrate 10 and a photosensitive layer 12, for example in accordance with the embodiments described above. The embodiment further includes a mask 70 which can be used to form the pillars 22, the caps 24, the unexposed regions 24, and the nozzle apertures 44. Mask 72 can include first regions 72 having a first transparency which define the plurality of nozzles 44, second regions 74 having a second transparency which is targeted to be less than the first transparency and which define the plurality of pillars 22, third regions 76 having a third transparency which is targeted to be less than the second transparency which define the plurality of caps 40, and fourth regions 78 having a fourth transparency which is targeted to be less than the third transparency which define the plurality of unexposed regions 24. In an embodiment, the first regions (i.e., transparent regions) 72 can have a transparency of between about 95% and about 100%, or between about 98% and about 100%, for example 99%. The fourth regions (i.e., opaque regions) 78 can have a transparency of between about 0% and about 0.01%. The second regions 74 can have a transparency of between about 0.2% and about 1.0%, or about 0.5%, and the third regions 76 can have a transparency of between about 0.02% and about 0.1%, for example about 0.05%. The various transparencies of regions 72-78 can be modified according to processing parameters such as laser power and wavelength, and composition and thickness of the photosensitive layer 12 and aperture plate substrate 10.

FIG. 7 further depicts a light source 80 which passes through mask regions 72-76 and illuminates the photosensitive layer 12 with varying intensities, and which is blocked by opaque regions 78. The light source 80 can be, for example, a laser beam output by an excimer laser and having a wavelength of between about 220 nm and about 300 nm, or about 248 nm, and having a pulse energy density of between about 0.5 J/cm$^2$ and about 4.0 J/cm$^2$, for example about 1.5 J/cm$^2$, with a pulse repetition count of between about 100 pulses and about 400 pulses, for example about 200 pulses.

The light impinging on transparent regions 72 can pass through the mask 70 unimpeded except for surface reflection of the mask 70, and illuminates exposed regions with sufficient intensity to ablate the photosensitive layer 12 and the aperture plate substrate 10 to form nozzles 44.

The light impinging on second regions 74 is somewhat blocked, and passes through the mask 70 with sufficient intensity to expose the photosensitive layer 12 through its entire thickness to form pillars 22, but with insufficient intensity to damage the photosensitive layer 12.

The light impinging on third regions 76 is blocked to a relatively high degree, but passes through the mask 70 with sufficient intensity to expose the upper portion 42 of photosensitive layer 12 to form caps 40, while regions 24 directly below the edges of caps 40 remains unexposed.

The light impinging on opaque regions 78 is blocked so that regions 24 of photosensitive layer 12 remain unexposed.

After exposure, the unexposed portions 24 of photosensitive layer 12 are removed using a developer according to the embodiments discussed above. An anti-wetting layer can also be formed, similar to layer 50 depicted in FIG. 4 and discussed above.

This embodiment thus exposes the photosensitive layer 12 to define the reentrant structure pillars and reentrant structure caps at the same time with the same light source. At the same time, this embodiment further exposes the aperture plate substrate 10 to the same light source at the same time to ablate the aperture plate substrate to form the plurality of aperture plate nozzles 44. The various transparencies of regions 72-78 are adjusted during mask design and formation so that the light source 80 illuminates the various regions of photosensitive layer 12 and aperture plate substrate 10 with an appropriate energy to define the pillars 22, the caps 40, the aperture plate nozzles 44, and the unexposed regions 24.

FIG. 7 also depicts a brace plate 82 which can be employed during the formation of the aperture plate. A polyimide aperture plate substrate 10 can be attached to the brace plate 82, such as a stainless steel brace plate 82, using an adhesive 84. The brace plate 82 can provide support for the aperture plate substrate 10 during formation of the aperture plate, as well as during the remaining stages of print head construction and operation. The brace plate 82 has a plurality of openings 86 each of which can be concentric with, but larger than, each aperture plate nozzle 44 within the aperture plate substrate 10. The brace plate openings 86 can be formed using chemical etching or other mechanical techniques prior to bonding the brace plate 82 to the aperture plate 10 using brace plate adhesive 84. Forming the brace plate openings 86 larger than aperture plate nozzles 44 allows for some misalignment between the aperture plate substrate 12 and the brace plate 80 during assembly. A diameter of the brace plate openings 86 can be about three times the diameter of the aperture plate nozzles 44 within the aperture plate substrate 12. Thus various embodiments of the present teachings can be used to form a plurality of reentrant structures 51, which includes pillars 22 and caps 40, for an aperture plate of an ink jet print head. The reentrant structures 51 can be formed from a single layer, thereby reducing processing time. Various embodiments of the present teachings can form the reentrant structures and aperture plate nozzles using one, two, or three masks.

In various embodiments, the reentrant structures 51 and the nozzles 44 are self-aligned with each other, for example because they are formed using the same mask. In other embodiments using two or more masks, alignment of the nozzles 44 with the reentrant structures 51 can be performed with high precision, as both the nozzles 44 and reentrant structures 51 can be accurately aligned with photolithographic registration marks during lithographic processing.

The reentrant structures 51 can improve anti-wetting of the aperture plate during use. After formation of reentrant structures 22,40 according to any of the embodiments described above, additional processing can be performed to complete formation of a print head for a printer. In an embodiment, the print head including an aperture plate having a plurality of reentrant structures formed in accordance with the present teachings can be used to form a printer.

Figure 8:
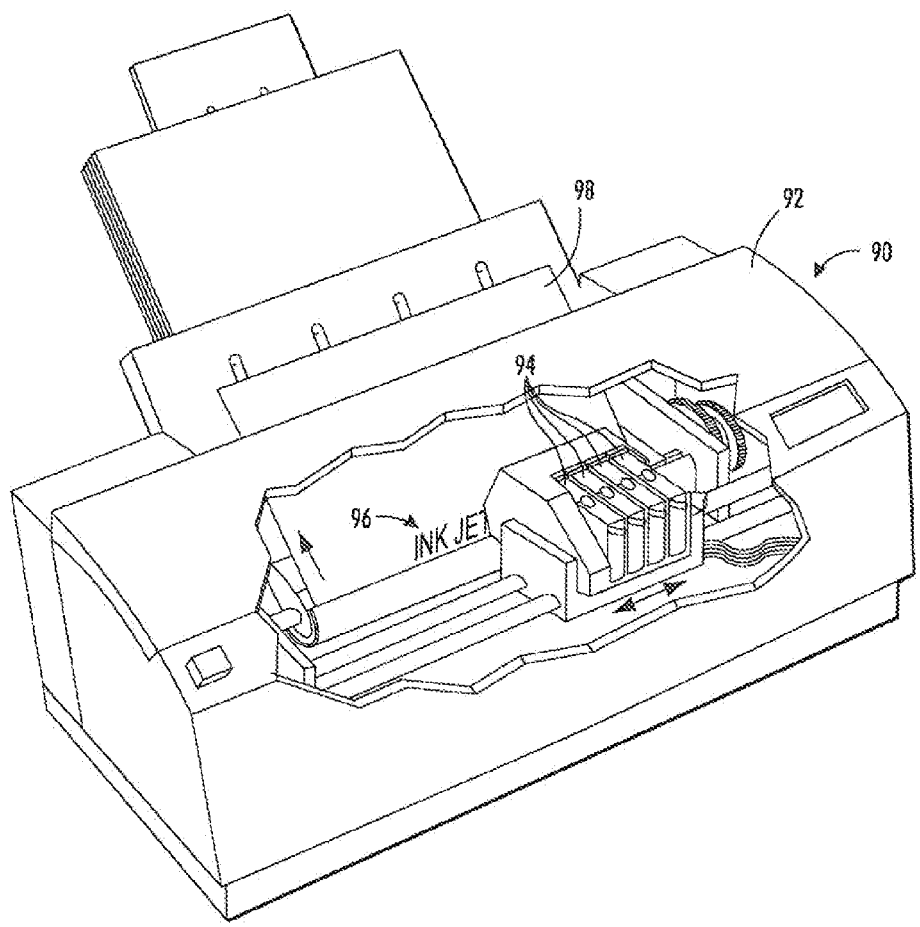
FIG. 8 is a perspective view of a printing device including a plurality of print heads each including an aperture plate and print head formed according to an embodiment of the present teachings.

FIG. 8 depicts a printer 90 including a printer housing 92 into which at least one print head 94 formed in accordance with the present teachings has been installed. One or more print heads 94 can include a plurality of reentrant structures 51. During operation of the printer 90, ink 96 is ejected from one or more nozzles 44 (FIG. 6) in accordance with an embodiment of the present teachings. Each print head 94 is operated in accordance with digital instructions to create a desired ink image 96 on a print medium 98 such as a paper sheet, plastic, etc. Each print head 94 may move back and forth relative to the print medium 98 in a scanning motion to generate the printed image swath by swath. Alternately, each print head 94 may be held fixed and the print medium 98 moved relative to it, creating an image as wide as the print head 94 in a single pass. Each print head 94 can be narrower than, or as wide as, the print medium 98. In another embodiment, each print head 94 can print to an intermediate surface such as a rotating drum or belt (not depicted for simplicity) for subsequent transfer to a print medium.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. For example, it will be understood that the caps 40 can be exposed prior to exposure of the pillars 22. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims. Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A method for forming an ink jet print head, comprising:
exposing a photosensitive layer to a first patterned light source to define a plurality of reentrant structure pillars, wherein unexposed portions of the photosensitive layer remain unexposed to the first light source during definition of the plurality of reentrant structure pillars;
exposing the photosensitive layer to a second patterned light source to define a plurality of reentrant structure caps for the plurality of reentrant structures, wherein unexposed portions of the photosensitive layer remain unexposed to the second light source during definition of the plurality of reentrant structure caps; and
after exposing the photosensitive layer to define the plurality of reentrant structure pillars and the plurality of reentrant structure caps, removing the unexposed portions of the photosensitive layer to form the plurality of reentrant structures.

2. The method of claim 1, wherein exposing the photosensitive layer to the second patterned light source exposes the photosensitive layer to a different light source than the first light source.

3. The method of claim 2, further comprising forming the photosensitive layer on a polymer aperture plate substrate.

4. The method of claim 3, further comprising ablating the polymer aperture plate substrate with one of the first light source and the second light source to form a plurality of aperture plate nozzles through the polymer aperture plate substrate.

5. The method of claim 4, wherein the formation of the photosensitive layer on the polymer aperture plate substrate forms the photosensitive layer on a polyimide aperture plate substrate.

6. The method of claim 5, further comprising providing the photosensitive layer by forming an SU-8 negative photoresist layer on the polyimide aperture plate substrate.

7. The method of claim 2, further comprising:
forming the photosensitive layer on a polyimide aperture plate substrate;
patterning the first light source through a first mask during the exposure of the photosensitive layer to the first light source to define the plurality of reentrant structure pillars;
patterning the second light source through a second mask which is different from the first mask during the exposure of the photosensitive layer to the second light source to define the plurality of reentrant structure caps; and
ablating the polyimide aperture plate substrate using one of the patterned first light source and the patterned second light source to form a plurality of aperture plate nozzles through the polyimide aperture plate substrate.

8. The method of claim 2, further comprising:
forming the photosensitive layer on a polyimide aperture plate substrate;
patterning the first light source through a first mask during the exposure of the photosensitive layer to define the plurality of reentrant structure pillars;
patterning the second light source through a second mask which is different from the first mask during the exposure of the photosensitive layer to define the plurality of reentrant structure pillars;
patterning a third light source through a third mask which is different from the first mask and the second mask; and
ablating the polyimide aperture plate substrate using the third patterned light source to form a plurality of aperture plate nozzles through the polyimide aperture plate substrate.

9. The method of claim 8, further comprising:
patterning the first light source through the first mask comprises patterning the first light source with a pillar mask comprising a plurality of transparent regions which define the plurality of reentrant structure pillars;
patterning the second light source through the second mask comprises patterning the second light source with a cap mask which is different from the pillar mask and comprises a plurality of transparent regions which define the plurality of reentrant layer caps; and
patterning the third light source through the third mask comprises patterning the third light source through a nozzle mask which is different from the pillar mask and the cap mask and comprises a plurality of transparent regions which define the plurality of aperture plate nozzles.

10. The method of claim 9, further comprising:
during the exposure of the photosensitive layer to define the plurality of reentrant structure pillars, exposing the photosensitive layer to the first light source having a wavelength of between about 330 nm and about 420 nm with a total exposure of between about 100 mJ/cm$^2$ and about 200 mJ/cm$^2$;
during the exposure of the photosensitive layer to define the plurality of reentrant structure caps, exposing the photosensitive layer to the second light source having a wavelength of between about 220 nm and about 330 nm with a total exposure of between about 50 mJ/cm$^2$ and about 200 mJ/cm$^2$; and
during the exposure of the photosensitive layer to define the plurality of aperture plate nozzles, exposing the photosensitive layer to the third light source having a wavelength of between about 193 nm and about 330 nm and a pulse energy density of between about 0.5 J/cm$^2$ and about 4.0 J/cm$^2$ for between about 100 pulses and about 400 pluses.

11. The method of claim 1, wherein:
exposing the photosensitive layer to the first light source exposes the photosensitive layer to a first light source having a wavelength of between about 330 nm and about 420 nm and to a total exposure of between about 100 mJ/cm$^2$ and about 200 mJ/cm$^2$; and
exposing the photosensitive layer to the second light source exposes the photosensitive layer to between about 100 pulses and about 400 pulses of a second light source having a wavelength of between about 220 nm and about 300 nm, wherein the second light source has a pulse energy density of between about 0.5 J/cm$^2$ and about 4.0 J/cm$^2$.

12. The method of claim 11, further comprising:
patterning the first light source with a first light mask comprising a plurality of transparent regions and a plurality of opaque regions, wherein the plurality of transparent regions define the plurality of reentrant structure pillars; and
patterning the second light source with a second light mask comprising a plurality of first regions having a transparency of between about 95% and about 100% which define a plurality of aperture plate nozzles, a plurality of second regions having a transparency of between about 0.015% and about 0.2% which define the plurality of reentrant structure caps, and a plurality of third regions having a transparency of between about 0% and about 0.01%.

13. The method of claim 1, wherein the first light source is the same as the second light source and the exposing of the photosensitive layer to the first light source and the exposing of the photosensitive layer to the second light source is performed at the same time to define the plurality of reentrant structure pillars and the plurality of reentrant structure caps during a single exposure to a single light source.

14. The method of claim 13, further comprising:
   forming the photosensitive layer on a polyimide aperture plate substrate; and
   exposing the polyimide aperture plate substrate to the first patterned light source during the definition of the plurality of reentrant structure pillars and the plurality of reentrant structure caps to ablate the polyimide aperture plate substrate to form a plurality of aperture plate nozzles through the polyimide aperture plate substrate.

15. The method of claim 13, wherein exposing the photosensitive layer to the single light source exposes the photosensitive layer to a laser beam having a wavelength of between about 220 nm and about 300 nm and having a pulse energy density of between about 0.5 J/cm$^2$ and about 4.0 J/cm$^2$ for between about 100 pulses and about 400 pulses.

16. The method of claim 13, further comprising patterning the first light source with a light mask comprising a plurality of first regions having a transparency of between about 95% and about 100% which define a plurality of aperture plate nozzles, a plurality of second regions having a transparency of between about 0.2% and about 1.0% which define the plurality of reentrant structure pillars, a plurality of third regions having a transparency of between about 0.02% and about 0.1% which define the plurality of reentrant structure caps, and a plurality of fourth regions having a transparency of between about 0% and about 0.01% which define the unexposed regions of the photosensitive layer.

17. The method of claim 16, wherein exposing the photosensitive layer to the single light source exposes the photosensitive layer to a laser beam having a wavelength of between about 220 nm and about 300 nm and having a pulse energy density of between about 0.5 J/cm$^2$ and about 4.0 J/cm$^2$ for between about 100 pulses and about 400 pulses.

* * * * *